US011174394B2

(12) United States Patent
Wojtczak et al.

(10) Patent No.: US 11,174,394 B2
(45) Date of Patent: Nov. 16, 2021

(54) SURFACE TREATMENT COMPOSITIONS AND ARTICLES CONTAINING SAME

(71) Applicant: Fujifilm Electronic Materials U.S.A., Inc., N. Kingstown, RI (US)

(72) Inventors: William A. Wojtczak, Mesa, AZ (US); Atsushi Mizutani, Woluwe-Saint-Lambert (BE); Keeyoung Park, Gilbert, AZ (US)

(73) Assignee: Fujifilm Electronic Materials U.S.A., Inc., N. Kingstown, RI (US)

( * ) Notice: Subject to any disclaimer, the term of this patent is extended or adjusted under 35 U.S.C. 154(b) by 0 days.

(21) Appl. No.: 16/223,396

(22) Filed: Dec. 18, 2018

(65) Prior Publication Data

US 2019/0211210 A1 Jul. 11, 2019

Related U.S. Application Data

(60) Provisional application No. 62/613,849, filed on Jan. 5, 2018, provisional application No. 62/649,685, filed on Mar. 29, 2018.

(51) Int. Cl.
*H01L 29/08* (2006.01)
*C09D 5/00* (2006.01)
*C09D 4/00* (2006.01)
*C09D 183/04* (2006.01)
*C09D 7/63* (2018.01)
*B08B 3/08* (2006.01)
*H01L 21/02* (2006.01)
*H01L 23/29* (2006.01)
*C09D 7/20* (2018.01)
*C08K 5/095* (2006.01)
*C08K 5/09* (2006.01)
*H01L 21/3105* (2006.01)
*C09D 7/40* (2018.01)
*H01L 21/306* (2006.01)

(52) U.S. Cl.
CPC .............. *C09D 5/00* (2013.01); *B08B 3/08* (2013.01); *C08K 5/09* (2013.01); *C08K 5/095* (2013.01); *C09D 4/00* (2013.01); *C09D 7/20* (2018.01); *C09D 7/63* (2018.01); *C09D 183/04* (2013.01); *H01L 21/02057* (2013.01); *H01L 21/02126* (2013.01); *H01L 23/296* (2013.01); *C09D 7/40* (2018.01); *H01L 21/306* (2013.01); *H01L 21/3105* (2013.01)

(58) Field of Classification Search
CPC .......... C09D 5/00; C09D 4/00; C09D 183/04; C09D 7/63; C09D 7/20; C09D 7/40; C08K 5/095; C08K 5/09; B08B 3/08; H01L 21/02126; H01L 21/02057; H01L 23/296; H01L 21/3105; H01L 21/306; C08L 83/04
See application file for complete search history.

(56) References Cited

U.S. PATENT DOCUMENTS

| | | | | |
|---|---|---|---|---|
| 4,217,466 A | * | 8/1980 | Kuhl | H01B 17/32 174/209 |
| 5,605,958 A | * | 2/1997 | Yoneda | C09D 4/00 106/287.11 |
| 6,147,157 A | * | 11/2000 | Inokuchi | C08K 5/5455 524/588 |
| 6,749,838 B1 | * | 6/2004 | Joichi | A61K 8/25 424/59 |
| 8,410,296 B2 | | 4/2013 | Yoshida et al. | |
| 8,623,131 B2 | | 1/2014 | Yoshida et al. | |
| 8,828,144 B2 | | 9/2014 | Kumon et al. | |
| 8,957,005 B2 | | 2/2015 | Kumon et al. | |
| 9,053,924 B2 | | 6/2015 | Kumon et al. | |
| 9,090,782 B2 | | 7/2015 | Saio et al. | |
| 9,133,352 B2 | | 9/2015 | Ohhashi et al. | |
| 9,228,120 B2 | | 1/2016 | Kumon et al. | |
| 9,244,358 B2 | | 1/2016 | Koshiyama et al. | |
| 9,281,178 B2 | | 3/2016 | Kumon et al. | |
| 9,653,307 B1 | | 5/2017 | Imonigie et al. | |
| 9,691,603 B2 | | 6/2017 | Kumon et al. | |
| 9,748,092 B2 | | 8/2017 | Kumon et al. | |
| 9,920,286 B2 | * | 3/2018 | Kumagai | C11D 7/08 |
| 2002/0037820 A1 | | 3/2002 | Small et al. | |
| 2002/0077412 A1 | * | 6/2002 | Kobayashi | C09D 183/04 524/588 |
| 2005/0038216 A1 | | 2/2005 | Kozawa et al. | |
| 2005/0093912 A1 | | 5/2005 | Vaideeswaran et al. | |
| 2005/0158480 A1 | | 7/2005 | Goodwin et al. | |
| 2005/0215072 A1 | | 9/2005 | Kevwitch et al. | |
| 2007/0026193 A1 | * | 2/2007 | Luzinov | B08B 17/06 428/141 |
| 2007/0218811 A1 | | 9/2007 | Kurata et al. | |
| 2008/0199977 A1 | | 8/2008 | Weigel et al. | |

(Continued)

FOREIGN PATENT DOCUMENTS

| | | | | |
|---|---|---|---|---|
| JP | 4535603 | 9/2010 | ............ | A61K 8/891 |
| JP | 2011-049468 | 3/2011 | ........... | H01L 21/027 |

(Continued)

OTHER PUBLICATIONS

International Search Report and Written Opinion of the International Searching Authority for International Application No. PCT/US19/43854 dated Oct. 21, 2019.
U.S. Appl. No. 15/928,152, filed Mar. 22, 2018, William A. Wojtczak.
U.S. Appl. No. 16/522,187, filed Jul. 25, 2019, William A. Wojtczak.
Matsumoto et al., "A Facile Silylation of Carboxylic Acids with Hexamethyldisiloxane", *Chemistry Letters*, pp. 1475-1478 (1980).
Supplementary European Search Report for European Application No. EP 18 77 2478 dated Dec. 4, 2019.
International Search Report and Written Opinion of the International Searching Authority for International Application No. PCT/US18//66179 dated May 7, 2019.

(Continued)

*Primary Examiner* — Caleb E Henry
(74) *Attorney, Agent, or Firm* — Fish & Richardson P.C.

(57) ABSTRACT

This disclosure relates to methods and compositions for treating a wafer having a pattern disposed on a surface of the wafer.

23 Claims, No Drawings

(56) References Cited

U.S. PATENT DOCUMENTS

| | | | |
|---|---|---|---|
| 2008/0209645 A1* | 9/2008 | Carrillo | C11D 17/047 8/137 |
| 2009/0198000 A1* | 8/2009 | Weinelt | C09D 183/04 524/188 |
| 2009/0311874 A1 | 12/2009 | Tomita et al. | |
| 2010/0056409 A1 | 3/2010 | Walker et al. | |
| 2011/0054184 A1 | 3/2011 | Yoshida et al. | |
| 2011/0214685 A1* | 9/2011 | Kumon | H01L 21/02052 134/1 |
| 2012/0017934 A1 | 1/2012 | Kumon et al. | |
| 2012/0164818 A1 | 6/2012 | Kumon et al. | |
| 2012/0211025 A1* | 8/2012 | Kumon | H01L 21/02057 134/3 |
| 2013/0056023 A1* | 3/2013 | Kumon | C09D 183/08 134/1.2 |
| 2013/0255534 A1 | 10/2013 | Ryokawa et al. | |
| 2013/0280123 A1 | 10/2013 | Chen et al. | |
| 2014/0162049 A1* | 6/2014 | Ding | C09D 183/04 428/313.9 |
| 2014/0272706 A1 | 9/2014 | Kon et al. | |
| 2014/0311379 A1 | 10/2014 | Ryokawa et al. | |
| 2015/0325458 A1 | 11/2015 | Printz | |
| 2016/0148802 A1 | 5/2016 | Kumon et al. | |
| 2016/0254140 A1 | 9/2016 | Saito et al. | |
| 2016/0279677 A1 | 9/2016 | Ball et al. | |
| 2016/0291477 A1 | 10/2016 | Mori et al. | |
| 2017/0062203 A1 | 3/2017 | Ryokawa et al. | |
| 2018/0277357 A1 | 9/2018 | Wojtczak et al. | |
| 2019/0074173 A1* | 3/2019 | Fukui | C07F 7/10 |
| 2019/0127540 A1* | 5/2019 | Senzaki | B01D 67/0093 |
| 2019/0203054 A1* | 7/2019 | Seki | C09D 5/00 |
| 2019/0203090 A1* | 7/2019 | Seki | H01L 21/02057 |

FOREIGN PATENT DOCUMENTS

| | | | |
|---|---|---|---|
| JP | 2012-015335 | 1/2012 | ........... H01L 21/304 |
| JP | 2012-033881 | 2/2012 | ........... H01L 21/304 |
| JP | 5708191 | 2/2012 | ........... H01L 21/304 |
| JP | 2013-168583 | 8/2013 | |
| JP | 6032338 | 3/2016 | ........... H01L 21/304 |
| JP | 2017-228612 | 12/2017 | ........... H01L 21/304 |

OTHER PUBLICATIONS

International Search Report and Written Opinion of the International Searching Authority for International Application No. PCT/US2018/023697 dated Jul. 6, 2018 (12 pages).

Extended European Search Report for European Application No. EP 18 89 8847 dated Jan. 21, 2021.

* cited by examiner

US 11,174,394 B2

SURFACE TREATMENT COMPOSITIONS AND ARTICLES CONTAINING SAME

CROSS REFERENCE TO RELATED APPLICATIONS

The present application claims priority to U.S. Provisional Application Ser. No. 62/613,849, filed on Jan. 5, 2018, and U.S. Provisional Application Ser. No. 62/649,685, filed on Mar. 29, 2018, which are hereby incorporated by reference in their entirety.

TECHNICAL FIELD

This disclosure relates generally to surface treatment, and more particularly to liquid treatment of semiconductor surfaces where formation of a hydrophobic layer is desired.

BACKGROUND

At sub-20 nm critical dimensions, pattern collapse of FinFET's and dielectric stacks during wet clean and drying has become a major problem in semiconductor manufacturing processes. The conventional theory of pattern collapse implicates high capillary forces during rinse and dry as major contributors leading to the collapse phenomenon. However, other chemical and substrate properties may play an important role as well, namely, liquid surface tension and viscosity, substrate mechanical strength, pattern density and aspect ratio, and cleaner chemistry damage to substrate surfaces.

SUMMARY

It has been found that low surface tension modifying fluids that impart the surfaces of a semiconductor substrate (e.g., a silicon or copper wafer) with a hydrophobic layer (e.g., a hydrophobic monolayer) can minimize the capillary forces that drive pattern collapse during a drying process. Without wishing to be bound by theory, it is believed that the Laplace pressure is minimized when the contact angle, i.e., the angle a liquid (e.g., water) creates when in contact with a substrate surface, is at or near 90 degrees. This in combination with the presence of a low surface tension fluid can greatly reduce the forces that cause pattern collapse.

In general, this disclosure provides methods and compositions for treating a patterned surface of a semiconductor substrate (e.g., a patterned wafer) where a hydrophobic layer is formed on the surface, thereby minimizing or preventing pattern collapse as the surface is subjected to typical cleaning and drying steps in a semiconductor manufacturing process. The methods disclosed herein employ compositions that form a hydrophobic layer on the surface such that the treated surface has a water contact angle of at least about 50 degrees.

In one aspect, this disclosure features methods for treating a semiconductor substrate having a pattern disposed on a surface of the wafer. Such methods can include contacting the surface with a surface treatment composition to form a surface treatment layer such that the surface treatment layer has a water contact angle of at least about 50 degrees. The surface treatment composition can include (e.g., comprise, consist of, or consist essentially of) at least one siloxane compound and at least one additive. The at least one additive includes an acid having a pKa of at most 0 or an anhydride thereof. The pattern can include a feature having a dimension of at most about 20 nm.

In another aspect, this disclosure features surface treatment compositions that include (1) at least one siloxane compound in an amount of from about 0.1 wt % to about 99.9 wt % of the surface treatment composition; and (2) at least one additive including an acid having a pKa of at most 0 or an anhydride thereof and being in an amount of from about 0.1 wt % to about 10 wt % of the surface treatment composition.

In another aspect, this disclosure features surface treatment compositions consisting of (1) at least one siloxane compound in an amount of from about 0.1 wt % to about 99.9 wt % of the surface treatment composition; (2) at least one additive including a compound selected from the group consisting of sulfonic acids and sulfonic anhydrides and being in an amount of from about 0.1 wt % to about 10 wt % of the surface treatment composition; and (3) optionally, at least one organic solvent.

In another aspect, this disclosure features articles that include a semiconductor substrate, and a surface treatment composition supported by the semiconductor substrate. The surface treatment composition can include at least one siloxane compound and at least one additive. The at least one additive includes an acid having a pKa of at most 0 or an anhydride thereof.

In still another aspect, this disclosure features kits that include a first container including at least one siloxane compound; and a second container including at least one additive. The at least one additive can include an acid having a pKa of at most 0 or an anhydride thereof.

Other features, objects, and advantages of the invention will be apparent from the description and the claims.

DETAILED DESCRIPTION

In some embodiments, this disclosure relates to surface treatment methods. Such methods can be performed, for example, by contacting the surface (e.g., a surface that has patterns) of a substrate (e.g., a semiconductor substrate such as a silicon or copper wafer) with a surface treatment composition that includes at least one (e.g., two, three, or four) siloxane compound and at least one (e.g., two, three, or four) additive including an acid having a pKa of at most 0 or an anhydride thereof. The pattern can include a feature having a dimension of at most about 20 nm. In general, the surface treatment composition forms a surface treatment layer (e.g., a hydrophobic monolayer) on the surface such that the surface has a water contact angle of at least about 50 degrees.

In some embodiments, semiconductor substrates that can be treated by the surface treatment compositions described herein are constructed of silicon, silicon germanium, silicon nitride, copper, Group III-V compounds such as GaAs, or any combination thereof. In some embodiments, the semiconductor substrate can be a silicon wafer, a copper wafer, a silicon dioxide wafer, a silicon nitride wafer, a silicon oxynitride wafer, a carbon doped silicon oxide wafer, a SiGe wafer, or a GaAs wafer. The semiconductor substrates may additionally contain exposed integrated circuit structures such as interconnect features (e.g., metal lines and dielectric materials) on their surfaces. Metals and metal alloys used for interconnect features include, but are not limited to, aluminum, aluminum alloyed with copper, copper, titanium, tantalum, cobalt, nickel, silicon, polysilicon titanium nitride, tantalum nitride, tin, tungsten, SnAg, SnAg/Ni, CuNiSn, CuCoCu, and/or CoSn. The semiconductor substrate may also contain layers of interlayer dielectrics, silicon oxide, silicon nitride, titanium nitride, silicon carbide, silicon oxide carbide, silicon oxide nitride, titanium oxide, and/or carbon doped silicon oxides.

In some embodiments, the semiconductor substrate surface to be treated by the surface treatment compositions described herein includes features containing $SiO_2$, SiN, TiN, SiOC, SiON, Si, SiGe, Ge, and/or W. In some embodiments, the substrate semiconductor surface includes features containing $SiO_2$ and/or SiN.

In general, the semiconductor substrate surface to be treated by the surface treatment compositions described herein includes patterns formed by a prior semiconductor manufacturing process (e.g., a lithographic process including applying a photoresist layer, exposing the photoresist layer to an actinic radiation, developing the photoresist layer, etching the semiconductor substrate beneath the photoresist layer, and/or removing the photoresist layer). In some embodiments, the patterns can include features having at least one (e.g., two or three) dimension (e.g., a length, a width, and/or a depth) of at most about 20 nm (e.g., at most about 15 nm, at most about 10 nm, or at most about 5 nm) and/or at least about 1 nm (e.g., at least about 2 nm or at least about 5 nm).

In general, the surface treatment compositions described herein can include at least one (two, three, or four) siloxane compound and at least one (e.g., two, three, or four) additive. A siloxane compound can be a disiloxane, an oligosiloxane, a cyclosilxoane, or a polysiloxane. As used herein, the term "oligosiloxane" refers to a compound having 3-6 siloxane units, and the term "polysiloxane" refers to a compound having more than 6 siloxane units.

Examples of suitable siloxane compounds that can be used in the surface treatment compositions described herein include hexamethyldisiloxane, 1,3-diphenyl-1,3-dimethyldisiloxane, 1,1,3,3-tetramethyldisiloxane, 1,1,1-triethyl-3,3-dimethyldisiloxane, 1,1,3,3-tetra-n-octyldimethyldisiloxane, bis(nonafluorohexyl)tetramethyldisiloxane, 1,3-bis(trifluoropropyl)tetramethyldisiloxane, 1,3-di-n-butyltetramethyldisiloxane, 1,3-di-n-octyltetramethyldisiloxane, 1,3-diethyltetramethyldisiloxane, 1,3-diphenyltetramethyldisiloxane, hexa-n-butyldisiloxane, hexaethyldisiloxane, hexavinyldisiloxane, 1,1,1,3,3-pentamethyl-3-acetoxydisiloxane, 1-allyl-1,1,3,3-tetramethyldisiloxane, 1,3-bis(3-aminopropyl)tetramethyldisiloxane, 1,3-bis(heptadecafluoro-1,1,2,2-tetrahydrodecyl)-tetramethyldisiloxane, 1,3-divinyltetraphenyldisiloxane, 1,3-divinyltetramethyl-di siloxane, 1,3-diallyltetrakis(trimethylsiloxy)disiloxane, 1,3-diallyltetramethyl-di siloxane, 1,3-diphenyltetrakis(dimethylsiloxy)disiloxane, (3-chloropropyl)pentamethyl-di siloxane, 1,3-divinyltetrakis(trimethylsiloxy)disiloxane, 1,1,3,3-tetraisopropyl-di siloxane, 1,1,3,3-tetravinyldimethyldisiloxane, 1,1,3,3-tetracyclopentyldichloro-di siloxane, vinylpentamethyldisiloxane, 1,3-bis(3-chloroisobutyl)tetramethyldisiloxane, hexaphenyldisiloxane, 1,3-bis[(bicyclo[2.2.1]hept-2-enyl)ethyl]tetramethyldisiloxane, 1,1,1-triethyl-3,3,3-trimethyldisiloxane, 1,3-bis(3-methacryloxypropyl)tetramethyl-di siloxane, 1,3-bis(chloromethyl)tetramethyldisiloxane, 1,1,3,3-tetramethyl-1,3-diethoxydisiloxane, 1,1,3,3-tetraphenyldimethyldisiloxane, methacryloxypentamethyl-di siloxane, pentamethyldisiloxane, 1,3-bis(3-chloropropyl)tetramethyldisiloxane, 1,3-bis(4-hydroxybutyl)tetramethyldisiloxane, 1,3-bis(triethoxysilylethyl)tetramethyl-di siloxane, 3-aminopropylpentamethyldisiloxane, 1,3-bis(2-aminoethylaminomethyl)-tetramethyldisiloxane, 1,3-bis(3-carboxypropyl)tetramethyldisiloxane, 1,3-dichloro-1,3-diphenyl-1,3-dimethyldisiloxane, 1,3-diethynyltetramethyldisiloxane, n-butyl-1,1,3,3-tetramethyldisiloxane, 1,3-dichlorotetraphenyldisiloxane, 1,3-dichlorotetramethyl-di siloxane, 1,3-di-t-butyldisiloxane, 1,3-dimethyltetramethoxydisiloxane, 1,3-divinyltetraethoxydisiloxane, 1,1,3,3-tetraethoxy-1,3-dimethyldisiloxane, vinyl-1,1,3,3-tetramethyldisiloxane, platinum-[1,3-bis(cyclohexyl)imidazol-2-ylidene hexachlorodisiloxane, 1,1,3,3-tetraisopropyl-1-chlorodisiloxane, 1,1,1-trimethyl-3,3,3-triphenyldisiloxane, 1,3-bis(trimethylsiloxy)-1,3-dimethyldisiloxane, 3,3-diphenyl-tetramethyltrisiloxane, 3-phenylheptamethyltrisiloxane, hexamethylcyclotrisiloxane, n-propylheptamethyltrisiloxane, 1,5-diethoxyhexamethyltrisiloxane, 3-ethylheptamethyl-trisiloxane, 3-(tetrahydrofurfuryloxypropyl)heptamethyltrisiloxane, 3-(3,3,3-trifluoropropyl)heptamethyltrisiloxane, 1,1,3,5,5-pentaphenyl-1,3,5-trimethyltrisiloxane, octamethyltrisiloxane, 1,1,5,5-tetraphenyl-1,3,3,5-tetramethyltrisiloxane, hexaphenylcyclotrisiloxane, 1,1,1,5,5,5-hexamethyltrisiloxane, octachlorotrisiloxane, 3-phenyl-1,1,3,5,5-pentamethyltrisiloxane, (3,3,3-trifluoropropyl)methylcyclotrisiloxane, 1,3,5-trivinyl-1,1,3,5,5-pentamethyltrisiloxane, 1,3,5-trivinyl-1,3,5-trimethylcyclotrisiloxane, 3-(3-acetoxypropyl)heptamethyltrisiloxane, 3-(m-pentadecylphenoxypropyl)heptamethyltrisiloxane, limonenyltrisiloxane, 3-dodecylheptamethyltrisiloxane, 3-octylheptamethyltrisiloxane, 1,3,5-triphenyltrimethylcyclotrisiloxane, 1,1,1,3,3,5,5-heptamethyltrisiloxane, 1,1,3,3,5,5-hexamethyltrisiloxane, 1,1,1,5,5,5-hexaethyl-3-methyltrisiloxane, 1,5-dichlorohexamethyltrisiloxane, 3-triacontylheptamethyltrisiloxane, 3-(3-hydroxypropyl)heptamethyltrisiloxane, hexamethylcyclomethylphosphonoxytrisiloxane, 3-octadecylheptamethyltrisiloxane, furfuryloxytrisiloxane, tetrakis(dimethylsiloxy)silane, 1,1,3,3,5,5,7,7-octamethyltetrasiloxane, a diphenyl siloxane-dimethylsiloxane copolymer, 1,3-diphenyl-1,3-dimethyldisiloxane, octamethylcyclotetrasiloxane, 1,3-bis(trimethylsiloxy)-1,3-dimethyldisiloxane, a dimethylsiloxane-[65-70%(60% propylene oxide/40% ethylene oxide)] block copolymer, bis(hydroxypropyl)tetramethyldisiloxane, tetra-n-propyltetramethylcyclotetrasiloxane, octaethylcyclotetrasiloxane, decamethyltetrasiloxane, dodecamethylcyclohexasiloxane, dodecamethylpentasiloxane, tetradecamethylhexasiloxane, hexaphenylcyclotrisiloxane, polydimethylsiloxane, polyoctadecylmethylsiloxane, hexacosyl terminated polydimethylsiloxane, decamethylcyclopentasiloxane, poly(3,3,3-trifluoropropylmethylsiloxane), trimethylsiloxy terminated polydimethylsiloxane, 1,1,3,3,5,5,7,7,9,9-decamethylpentasiloxane, and triethylsiloxy terminated polydiethylsiloxane.

In some embodiments, the at least one siloxane compound can be from at least about 0.1 wt % (e.g., at least about 1 wt %, at least about 5 wt %, at least about 10 wt %, at least about 20 wt %, at least about 30 wt %, at least about 40 wt %, at least about 50 wt %, at least about 60 wt %, at least about 70 wt %, at least about 80 wt %, at least about 90 wt %, at least about 95 wt %, at least about 97 wt %, or at least about 99 wt %) to at most about 99.9 wt % (e.g., at most about 99 wt %, at most about 98 wt %, at most about 96 wt %, at most about 94 wt %, at most about 92 wt %, at most about 90 wt %, at most about 85 wt %, at most about 80 wt %, at most about 75 wt %, at most about 70 wt %, at most about 65 wt %, at most about 60 wt %, at most about 55 wt %, or at most about 55 wt %) of the surface treatment compositions described herein.

In some embodiments, the additives contemplated for use in the surface treatment compositions described herein can include an acid having a pKa of at most 0 or an anhydride thereof. Examples of such acids or their anhydrides include methanesulfonic acid, trifluoromethanesulfonic acid, methanesulfonic anhydride, trifluoromethanesulfonic anhydride, perchloric acid, nitric acid, sulfuric acid, toluenesulfonic acid, dodecylbenzenesulfonic acid, hydroiodic acid, hydrobromic acid, hydrochloric acid, chloric acid, trichloroacetic acid, trifluoroacetic acid, and fluorosulfuric acid. In some embodiments, the at least one additive can further include a second additive (e.g., an acid having a pKa of at least 0 or an anhydride thereof) different from an acid having a pKa of at most 0. An example of such a second additive is acetic anhydride.

In some embodiments, the at least one additive can be from at least about 0.1 wt % (e.g., at least about 0.5 wt %, at least about 1 wt %, at least about 1.5 wt %, at least about 2 wt %, at least about 2.5 wt %, at least about 3 wt %, at least about 3.5 wt %, at least about 4 wt %, at least about 4.5 wt %, or at least about 5 wt %) to at most about 10 wt % (e.g., at most about 9 wt %, at most about 8 wt %, at most about 7 wt %, at most about 6 wt %, at most about 5 wt %, at most about 4 wt %, or at most about 3 wt %) of the surface treatment compositions described herein.

Without wishing to be bound by theory, it is believed that, during use of the surface treatment compositions, the additive (e.g., a strong acid) can react with the siloxane compound to form a silylated compound, which can facilitate the formation of a hydrophobic siloxane unit onto the surface to be treated, which in turn can minimize the capillary forces that drive pattern collapse during a rinsing or drying process.

In some embodiments, the surface treatment compositions described herein can further include at least one organic solvent, such as anhydrides, glycol ethers, glycol ether acetates, alkanes, aromatic hydrocarbons, sulfones, sulfoxides, ketones, aldehydes, esters, lactams, lactones, acetals, hemiacetals, alcohols, carboxylic acids (e.g., those having a pKa of at least 0) and ethers. Examples of suitable solvents include acetic anhydride, propylene glycol methyl ether acetate, a $C_6$-$C_{16}$ alkane, toluene, xylene, mesitylene, tetraethylene glycol dimethyl ether, propylene glycol dimethyl ether, ethylene glycol dimethyl ether, dipropylene glycol dimethyl ether, diethylene glycol dimethyl ether, dipropylene glycol dibutylether, n-dibutyl ether, dimethylsulfone, sulfolane, benzyl alcohol, t-butyl alcohol, t-amyl alcohol, methyl ethyl ketone, acetic acid, and isobutyl methyl ketone. In some embodiments, the surface treatment compositions described herein can be substantially free of an organic solvent.

In some embodiments, the at least one organic solvent can be from at least about 3 wt % (e.g., at least about 5 wt %, at least about 10 wt %, at least about 20 wt %, at least about 30 wt %, at least about 40 wt %, at least about 50 wt %, at least about 60 wt %, at least about 70 wt %, at least about 80 wt %, or at least about 90 wt %) to at most about 95 wt % (e.g., at most about 85 wt %, at most about 75 wt %, at most about 65 wt %, at most about 55 wt %, at most about 45 wt %, at most about 35 wt %, or at most about 25 wt %) of the surface treatment compositions described herein.

In some embodiments, the surface treatment compositions described herein can include only three types of components, i.e., (1) at least one siloxane compound, (2) at least one additive, and (3) at least one organic solvent. In some embodiments, the at least one organic solvent is optional and can be omitted from the surface treatment compositions described herein. In some embodiments, the surface treatment compositions described herein can be substantially free of a solvent (such as water or an organic solvent). As used herein, the term "substantially free" refers to the weight % of a component being at most about 0.1% (e.g., at most about 0.05%, at most about 0.01%, at most about 0.005%, at most about 0.001%, or at about 0%).

Without wishing to be bound by theory, it is believed that the surface treatment composition can form a surface treatment layer (e.g., a hydrophobic layer such as a hydrophobic monolayer) on a patterned surface of a semiconductor substrate such that the patterned surface has a water contact angle of at least about 50 degrees (e.g., at least about 55 degrees, at least about 60 degrees, at least about 65 degrees, at least about 70 degrees, at least about 75 degrees, at least about 80 degrees, at least about 85 degrees, at least about 89 degrees, at least about 90 degrees, at least about 95 degrees, or at least about 100 degrees). Without wishing to be bound by theory, it is believed that such a surface treatment layer can prevent or minimize the collapse of the patterned features (e.g., having a dimension of at most about 20 nm) on the semiconductor substrate during a drying step typically used in the semiconductor manufacturing process.

In some embodiments, the surface treatment compositions described herein can specifically exclude one or more of the additive components, in any combination, if more than one. Such components are selected from the group consisting of non-aromatic hydrocarbons, silazanes (e.g., cyclic silazanes or heterocyclic silazanes), protic solvents (e.g., alcohols or amides), lactones (e.g., those with 5- or 6-membered rings), certain Si-containing compounds (e.g., those having a Si—H group or an aminosilyl group), polymers, oxygen scavengers, quaternary ammonium salts including quaternary ammonium hydroxides, amines, bases (such as alkaline bases (e.g., NaOH, KOH, LiOH, $Mg(OH)_2$, and $Ca(OH)_2$)), surfactants, defoamers, fluoride-containing compounds (e.g., HF, $H_2SiF_6$, $H_2PF_6$, $HBF_4$, $NH_4F$, and tetraalkylammonium fluoride), oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, hydroxycarboxylic acids, carboxylic and polycarboxylic acids lacking amino groups, silanes (e.g., alkoxysilanes), cyclic compounds (e.g., cyclic compounds containing at least two rings, such as substituted or unsubstituted naphthalenes, or substituted or unsubstituted biphenylethers) other than the cyclosiloxanes described herein, chelating agents (e.g., azoles, diazoles, triazoles, or tetrazoles), corrosion inhibitors (such as azole or non-azole corrosion inhibitors), buffering agents, guanidine, guanidine salts, pyrrolidone, polyvinyl pyrrolidone, metal halides, and metal-containing catalysts.

In some embodiments, the surface treatment methods described herein can further include contacting the surface of a substrate with at least one aqueous cleaning solution before contacting the surface with a surface treatment composition. In such embodiments, the at least one aqueous cleaning solution can include water, an alcohol, aqueous ammonium hydroxide, aqueous hydrochloric acid, aqueous hydrogen peroxide, an organic solvent, or a combination thereof.

In some embodiments, the surface treatment methods described herein can further include contacting the surface of a substrate with a first rinsing solution (e.g., water, an organic solvent such as isopropanol, or a combination thereof) after contacting the surface with the at least one aqueous cleaning solution but before contacting the surface with the surface treatment composition. In some embodiments, the surface treatment methods described herein can further include contacting the surface with a second rinsing solution (e.g., water, an organic solvent such as isopropanol, or a combination thereof) after contacting the surface with the surface treatment composition. In some embodiments, the surface treatment methods described herein can further include drying the surface (e.g., after contacting the surface with first rinsing solution, the surface treatment composition, or the second rinsing solution). In some embodiments, the surface treatment methods described herein can further include removing the surface treatment layer from the surface.

In some embodiments, this disclosure provides methods for cleaning a semiconductor substrate (e.g., a wafer) having a pattern disposed on a surface of the substrate. Such methods can be performed, for example, by:

a) optionally, contacting the surface with an aqueous cleaning solution;

b) optionally, contacting the surface with a first rinsing solution;

c) contacting the surface with a surface treatment composition, wherein the surface treatment composition includes at least one siloxane compound and at least one additive, in which the at least one additive includes an acid having a pKa of at most 0 or an anhydride thereof, and the surface treatment composition forms a surface treatment layer on the surface such that the surface has a water contact angle of at least about 50 degrees;

d) optionally, contacting the surface with a second rinsing solution;

e) drying the surface; and f) optionally, removing the surface treatment layer to form a cleaned, patterned surface.

In such embodiments, the pattern can include a feature having a dimension of at most about 20 nm.

In step a) of the above described methods, the substrate (e.g., a wafer) bearing a patterned surface can optionally be treated with one or more aqueous cleaning solutions. When the patterned surface is treated with two or more aqueous cleaning solutions, the cleaning solutions can be applied sequentially. The aqueous cleaning solutions can be water alone or can be solutions containing water, a solute, and optionally an organic solvent. In some embodiments, the aqueous cleaning solutions can include water, an alcohol (e.g., a water soluble alcohol such as isopropanol), an aqueous ammonium hydroxide solution, an aqueous hydrochloric acid solution, an aqueous hydrogen peroxide solution, an organic solvent (e.g., a water soluble organic solvent), or a combination thereof.

In step b), the cleaning solution from step a) can be optionally rinsed away using a first rinsing solution. The first rinsing solution can include water, an organic solvent (e.g., isopropanol), or an aqueous solution containing an organic solvent. In some embodiments, the first rinsing solution is at least partially miscible with the cleaning solution used in step a). In some embodiments, step b) can be omitted when the cleaning solution used in step a) is not moisture sensitive or does not contain any appreciable amount of water.

In step c), the substrate surface can be treated with a surface treatment composition of the disclosure described above to form a modified surface having a surface treatment layer (e.g., a hydrophobic layer). The modified surface thus formed can be hydrophobic and can have a water contact angle of at least about 50 degrees. In some embodiments, the contact angle can be at least about 55 degrees (e.g., at least about 60 degrees, at least about 65 degrees, at least about 70 degrees, at least about 75 degrees, at least about 80 degrees, at least about 85 degrees, at least about 90 degrees, at least about 95 degrees, or at least about 100 degrees) and/or at most about 180 degrees (e.g., at most about 170 degrees, at most about 160 degrees, or at most about 150 degrees). In some embodiments, this step can be performed at a temperature of about 20-35° C. for a process time ranging from about 10 seconds to about 300 seconds.

In step d), after the substrate surface is treated with a surface treatment composition, the surface can be rinsed with a second rinsing solution. The second rinsing solution can include water, an organic solvent (e.g., isopropanol), or an aqueous solution containing an organic solvent. In some embodiments, this step can be performed at a temperature of about 20-70° C.

In step e), the substrate surface can be dried (e.g., by using a pressurized gas). Without wishing to be bound by theory, it is believed that, after the substrate surface is treated with a surface treatment composition described herein, the collapse of patterns on the surface during this drying step is minimized.

In step f), after the drying step, the surface treatment layer (e.g., a hydrophobic layer) can optionally be removed. In general, the surface treatment layer can be removed by a number of methods depending on the chemical characteristics of the modified surface. Suitable methods for removing the surface treatment layer include plasma sputtering; plasma ashing; thermal treatment at atmospheric or sub atmospheric pressure; treatment with an acid, base, oxidizing agent or solvent containing condensed fluid (e.g., supercritical fluids such as supercritical $CO_2$); vapor or liquid treatment; UV irradiation; or combinations thereof.

The semiconductor substrate having a cleaned, patterned surface prepared by the method described above can be further processed to form one or more circuits on the substrate or can be processed to form into a semiconductor device (e.g., an integrated circuit device such as a semiconductor chip) by, for example, assembling (e.g., dicing and bonding) and packaging (e.g., chip sealing).

In some embodiments, this disclosure features articles (e.g., an intermediate semiconductor article formed during the manufacturing of a semiconductor device) that includes a semiconductor substrate, and a surface treatment composition described herein supported by the semiconductor substrate. The surface treatment composition can include at least one siloxane compound and at least one additive comprising an acid having a pKa of at most 0 or an anhydride thereof, such as those described above.

In some embodiments, this disclosure features kits that include a first container including at least one siloxane compound described above; and a second container including at least one additive described above. If desired, the first or second container can further include at least one organic solvent to form a solution with the components in each container. In some embodiments, the components in the first and second containers can be mixed to form a surface treatment composition at the point of use right before applying the surface treatment composition to a surface of a semiconductor substrate. Without wishing to be bound by theory, it is believed that such a method is particularly suitable for a surface treatment composition having a relatively short shelf life. In embodiments where a surface treatment composition has a relatively long shelf life, the components in the first and second containers can be mixed to form one solution, which can be stored for a relative long period of time before use.

The present disclosure is illustrated in more detail with reference to the following examples, which are for illustrative purposes and should not be construed as limiting the scope of the present disclosure.

Example 1

Surface Treatment Solutions (i.e., formulations 1-20) were prepared by mixing the components at room temperature. The compositions of formulations 1-20 are summarized in Table 1 below. All percentages listed in Table 1 are weight percentages, unless indicated otherwise.

The Coupons containing $SiO_2$ films on Si substrates were cut into 1×1 inch squares. The coupons were immersed vertically into 100 mL of stirred (50 RPM) Surface Treatment Solutions and were kept at room temperature for 30 seconds. The coupons were then rinsed with isopropanol at 50° C. for 60 seconds and dried by using pressurized nitrogen gas.

The coupons were placed on the AST VCA 3000 Contact Angle Tool and the following procedure was followed to measure the contact angles:

1. Place the $SiO_2$ coupon onto the stage.
2. Raise the stage upward by rotating Vertical Knob clockwise until the specimen is just below the needle.
3. Dispense a drop of De-ionized water, lightly touching the specimen surface, then lower the specimen until the droplet separates from the needle tip.
4. Center the drop across the field-of-view using transverse knob for stage adjustment.
5. Focus the drop in field-of-view to get a sharp image by moving the stage along guide rails.
6. Click the "AutoFAST" button to freeze the image and calculate. Two numbers will be displayed; these are the left and right contact angles.
7. To calculate manually, use the mouse to place five markers around the droplet.
8. Select the droplet icon from the Main Menu to calculate the contact angle.
9. This will create a curve fit and tangent lines on the image. Two numbers will be displayed in the left-hand-corner of the screen; these are the left and right contact angles.
10. Repeat above procedure at 3 substrate sites and average the resulting contact angles and report the average result in Table 1.

TABLE 1

| Form. # | Siloxane | Solvent(s) | Additives | $SiO_2$ CA[1] |
|---|---|---|---|---|
| 1 | 5% HMDSO[2] | 43.5% PGMEA[3] 50% n-Decane | 1.5% Triflic acid | 82.6 |
| 2 | 95.5% HMDSO | — | 1.5% Triflic acid 3% Acetic anhydride | 89.30 |
| 3 | 88.5% HMDSO | 10% Acetic Anhydride | 1.5% Triflic acid | 86.2 |
| 4 | 68.5% HMDSO | 30% Acetic Anhydride | 1.5% Triflic acid | 87.8 |
| 5 | 48.5% HMDSO | 50% Acetic Anhydride | 1.5% Triflic acid | 87.7 |
| 6 | 97% HMDSO | — | 3% Triflic acid | 95.8 |
| 7 | 97% HMDSO | — | 3% Methane sulfonic acid | 86.8 |
| 8 | 99% HMDSO | — | 1% Triflic acid | 95.5 |
| 9 | 95% HMDSO | — | 5% Triflic acid | 95.8 |
| 10 | 72% HMDSO | 25% Xylene | 3% Triflic acid | 93.9 |
| 11 | 47% HMDSO | 50% Xylene | 3% Triflic acid | 93.9 |
| 12 | 97% HMDSO | — | 3% Methane sulfonic anhydride | 80.8 |
| 13 | 97% HMDSO | — | 3% Trifluoromethane sulfonic anhydride | 94.3 |
| 14 | 47% HMDSO | 50% n-Decane | 3% Methane sulfonic anhydride | 71.7 |
| 15 | 47% HMDSO | 50% n-Decane | 3% Methane sulfonic acid | 77.6 |
| 16 | 47% HMDSO | 50% n-Decane | 3% Trifluoromethane sulfonic anhydride | 98.4 |
| 17 | 47% HMDSO | 50% Isopar G | 3% Trifluoromethane sulfonic anhydride | 98.1 |
| 18 | 47% HMDSO | 50% Isopar H | 3% Trifluoromethane sulfonic anhydride | 99.4 |
| 19 | 47% HMDSO | 50% Isopar P | 3% Trifluoromethane sulfonic anhydride | 100.9 |
| 20 | 47% HMDSO | 50% Solvesso 200ND | 3% Trifluoromethane sulfonic anhydride | 100 |

[1] "CA" refers to contact angle (degrees)
[2] "HMDSO" refers to hexamethyldisiloxane
[3] "PGMEA" refers to propylene glycol methyl ether acetate As shown in Table 1, all of formulations 1-20 (which contained a siloxane, a strong acid, and optionally an aprotic solvent) exhibited relatively large contact angles on a $SiO_2$ surface.

Example 2

Surface treatment solutions (i.e., formulations 21-56) were prepared by mixing the components at room temperature. The compositions of formulations 21-56 are summarized in Table 2 below. All percentages listed in Table 2 are weight percentages, unless indicated otherwise.

The contact angle results in Table 2 were obtained using the same method outlined in Example 1.

The silicon pillar collapse test results in Table 2 were obtained using the following procedures: Patterned wafers were treated with formulations 21-56. Si pillar (with an aspect ratio of 22) patterned wafers were diced into 0.5 inch by 0.5 inch coupons. The coupons were then immersed into stirred 25° C. surface treatment solutions for 180 seconds. The coupons were removed from the surface treatment solutions, rinsed in a beaker containing isopropyl at room temperature for 30 seconds, and rinsed in a beaker containing stirred 50° C. isopropyl alcohol for 60 seconds. The coupons were then removed from the isopropyl alcohol rinse and dried with a N2 gas dispense gun oriented perpendicularly to the coupon at a working distance of 1 inch with gas pressure of 45 psi. The coupons were then analyzed by scanning electron microscopy over three randomly selected sites at a magnification of 50000× and the number of non-collapsed silicon pillars were tabulated. The average of non-collapsed Si-pillars at the three sites are reported in Table 2 as a percentage of the total Si pillars observed.

TABLE 2

| Form. # | Siloxane | Solvent(s) | Additives | $SiO_2$ CA[1] | Non-Collapsed Si Pillars |
|---|---|---|---|---|---|
| 21 | 10% HMDSO[2] | 87% Acetic acid | 3% Triflic acid | — | 96.6% |
| 22 | 20% HMDSO | 77% Acetic acid | 3% Triflic acid | — | 99.0% |
| 23 | 10% HMDSO | 40% Acetic acid 47% Tetraglyme[3] | 3% Triflic acid | — | 97.9% |
| 24 | 20% HMDSO | 40% Acetic acid 37% Tetraglyme | 3% Triflic acid | — | 98.8% |
| 25 | 16.6% HMDSO | 80.4% Acetic acid | 3% Triflic acid | — | 87.8% |
| 26 | 13.3% HMDSO | 83.7% Acetic acid | 3% Triflic acid | — | 98.3% |
| 27 | 16.6% HMDSO | 80.9% Acetic acid | 2.5% Triflic acid | — | 96.2% |
| 28 | 13.3% HMDSO | 84.2% Acetic acid | 2.5% Triflic acid | — | 94.3% |
| 29 | 16.6% HMDSO | 81.4% Acetic acid | 2% Triflic acid | — | 98.8% |
| 30 | 13.3% HMDSO | 84.7% Acetic acid | 2% Triflic acid | — | 99% |
| 31 | 13.3% HMDSO | 83.7% Acetic acid | 2% Triflic acid 1% Acetic anhydride | — | 97.8% |
| 32 | 7.5% HMDSO | 89.5% Acetic acid | 3% Triflic acid | — | 98.6% |
| 33 | 5% HMDSO | 92% Acetic acid | 3% Triflic acid | — | 97.1% |
| 34 | 13.3% HMDSO | 84.7% Acetic acid | 2% Triflic acid | — | 98.3% |
| 35 | 13.3% HMDSO | 85.7% Acetic acid | 1% Triflic acid | — | 94.1% |
| 36 | 10% HMDSO | 88% Acetic acid | 2% Triflic acid | 93.4 | 99.7% |
| 37 | 10% HMDSO | 87% Acetic acid | 2% Triflic acid 1% Acetic anhydride | 92.5 | 99.2% |
| 38 | 10% HMDSO | 90% Acetic acid | — | 42.8 | — |
| 39 | 10% HMDSO | 89% Acetic acid | 1% Acetic anhydride | 48.7 | — |
| 40 | 10% HMDSO | 88% Acetic anhydride | 2% Triflic acid | 92.7 | ~50% |
| 41 | 10% HMDSO | 88% Acetic acid | 2% Trifluoroacetic acid | 40.8 | — |
| 42 | 10% HMDSO | 87% Acetic acid | 1% Acetic anhydride 2% Trifluoroacetic acid | 42.1 | — |
| 43 | 10% HMDSO | 79% Acetic acid | 1% Acetic anhydride 10% Methanesulfonic acid | 91.2 | <10% |
| 44 | 10% HMDSO | 77% Acetic acid | 1% Acetic anhydride 10% Methanesulfonic acid | 93.6 | <10% |
| 45 | 13.3% HMDSO | 86.2% Acetic acid | 0.5% Triflic acid | — | 96.6% |
| 46 | 13.3% HMDSO | 86.5% Acetic acid | 0.2% Triflic acid | — | 96.6% |
| 47 | 5% HMDSO | 93% Acetic acid | 2% Triflic acid | — | 94.2% |
| 48 | 7.5% HMDSO | 90.5% Acetic acid | 2% Triflic acid | — | 96.2% |
| 49 | 1% HMDSO | 96% Acetic acid | 2% Triflic acid 1% Acetic anhydride | — | 93.4% |
| 50 | 5% HMDSO | 92% Acetic acid | 2% Triflic acid 1% Acetic anhydride | — | 99.0% |
| 51 | 13.3% HMDSO | 82.7% Acetic acid | 2% Triflic acid 1% Acetic anhydride 1% Triflic anhydride | — | 98.4% |
| 52 | 1% HMDSO | 95% Acetic acid | 2% Triflic acid 1% Acetic anhydride 1% Triflic anhydride | — | 98.8% |
| 53 | 13.3% HMDSO | 83.7% Acetic acid | 2% Triflic acid 1% Triflic anhydride | — | 98.6% |
| 54 | 13.3% HMDSO | 83.1% Acetic acid | 2% Triflic acid 1.6% Triflic anhydride | — | 97.7% |
| 55 | 13.3% HMDSO | 84.7% Acetic acid | 1.69% Triflic acid 0.31% Triflic anhydride | — | 93.4% |
| 56 | 13.3% HMDSO | 84.7% Acetic acid | 0.4% Triflic acid 1.6% Triflic anhydride | — | 93.6% |

[1]"CA" refers to contact angle (degrees)
[2]"HMDSO" refers to hexamethyldisiloxane
[3]"Tetraglyme" refers to tetraethylene glycol dimethyl ether As shown in Table 2, upon treatment with formulations 21-37 and 45-56, a substantial portion of silicon pillars on patterned silicon wafers remained after a cleaning or drying process. In addition, formulations 36 and 37 exhibited relatively large contact angles on a $SiO_2$ surface. By contrast, formulations 38 and 39 (which did not contain an acid having a pKa less than 0) exhibited relatively small contact angles on a $SiO_2$ surface.

Other embodiments are within the scope of the following claims.

What is claimed is:

1. A surface treatment composition, comprising:
   at least one siloxane compound in an amount of from about 20 wt % to about 99.9 wt % of the surface treatment composition, wherein the at least one siloxane compound comprises a disiloxane, an oligosiloxane, a cyclosilxoane, or a polysiloxane, provided that the at least one siloxane compound is not a polydimethylsiloxane; and
   at least one additive comprising an acid having a pKa of at most 0 or an anhydride thereof in an amount of from about 0.1 wt % to about 10 wt % of the surface treatment composition.

2. The composition of claim 1, wherein the at least one siloxane compound comprises hexamethyldisiloxane, 1,3-diphenyl-1,3-dimethyldisiloxane, 1,1,3,3-tetramethyldisiloxane, 1,1,1-triethyl-3,3-dimethyldisiloxane, 1,1,3,3-tetra-n-octyldimethyldisiloxane, bis(nonafluorohexyl)tetramethyldisiloxane, 1,3-bis(trifluoropropyl)tetramethyldisiloxane, 1,3-di-n-butyltetramethyldisiloxane, 1,3-di-n-octyltetramethyldisiloxane, 1,3-diethyltetramethyldisiloxane, 1,3-diphenyltetramethyldisiloxane, hexa-n-butyldisiloxane, hexaethyldisiloxane, hexavinyldisiloxane, 1,1,1,3,3-pentamethyl-3-acetoxydisiloxane, 1-allyl-1,1,3,3-tetramethyldisiloxane, 1,3-bis(3-aminopropyl)tetramethyldisiloxane, 1,3-bis(heptadecafluoro-1,1,2,2-tetrahydrodecyl)tetramethyldisiloxane, 1,3-divinyltetraphenyldisiloxane, 1,3-divinyltetramethyldisiloxane, 1,3-diallyltetrakis(trimethylsiloxy)disiloxane, 1,3-diallyltetramethyldisiloxane, 1,3-diphenyltetrakis(dimethylsiloxy)disiloxane, (3-chloropropyl)pentamethyldisiloxane, 1,3-divinyltetrakis(trimethylsiloxy)disiloxane, 1,1,3,3-tetraisopropyldisiloxane, 1,1,3,3-tetravinyldimethyldisiloxane, 1,1,3,3-tetracyclopentyldichlorodisiloxane, vinylpentamethyldisiloxane, 1,3-bis(3-chloroisobutyl)tetramethyldisiloxane, hexaphenyldisiloxane, 1,3-bis[(bicyclo[2.2.1]hept-2-enyl)ethyl]tetramethyldisiloxane, 1,1,1-triethyl-3,3,3-trimethyldisiloxane, 1,3-bis(3-methacryloxypropyl)tetramethyldisiloxane, 1,3-bis(chloromethyl)tetramethyldisiloxane, 1,1,3,3-tetramethyl-1,3-diethoxydisiloxane, 1,1,3,3-tetraphenyldimethyldisiloxane, methacryloxypentamethyldisiloxane, pentamethyldisiloxane, 1,3-bis(3-chloropropyl)tetramethyldisiloxane, 1,3-bis(4-hydroxybutyl)tetramethyldisiloxane, 1,3-bis(triethoxysilylethyl)tetramethyldisiloxane, 3-aminopropylpentamethyldisiloxane, 1,3-bis(2-aminoethylaminomethyl)tetramethyldisiloxane, 1,3-bis(3-carboxypropyl)tetramethyldisiloxane, 1,3-dichloro-1,3-diphenyl-1,3-dimethyldisiloxane, 1,3-diethynyltetramethyldisiloxane, n-butyl-1,1,3,3-tetramethyldisiloxane, 1,3-dichlorotetraphenyldisiloxane, 1,3-dichlorotetramethyldisiloxane, 1,3-di-t-butyldisiloxane, 1,3-dimethyltetramethoxydisiloxane, 1,3-divinyltetraethoxydisiloxane, 1,1,3,3-tetraethoxy-1,3-dimethyldisiloxane, vinyl-1,1,3,3-tetramethyldisiloxane, platinum-[1,3-bis(cyclohexyl)imidazol-2-ylidene hexachlorodisiloxane, 1,1,3,3-tetraisopropyl-1-chlorodisiloxane, 1,1,1-trimethyl-3,3,3-triphenyldisiloxane, 1,3-bis(trimethylsiloxy)-1,3-dimethyldisiloxane, 3,3-diphenyltetramethyltrisiloxane, 3-phenylheptamethyltrisiloxane, hexamethylcyclotrisiloxane, n-propylheptamethyltrisiloxane, 1,5-diethoxyhexamethyltrisiloxane, 3-ethylheptamethyltrisiloxane, 3-(tetrahydrofurfuryloxypropyl)heptamethyltrisiloxane, 3-(3,3,3-trifluoropropyl)heptamethyltrisiloxane, 1,1,3,5,5-pentaphenyl-1,3,5-trimethyltrisiloxane, octamethyltrisiloxane, 1,1,5,5-tetraphenyl-1,3,3,5-tetramethyltrisiloxane, hexaphenylcyclotrisiloxane, 1,1,1,5,5,5-hexamethyltrisiloxane, octachlorotrisiloxane, 3-phenyl-1,1,3,5,5-pentamethyltrisiloxane, (3,3,3-trifluoropropyl)methylcyclotrisiloxane, 1,3,5-trivinyl-1,1,3,5,5-pentamethyltrisiloxane, 1,3,5-trivinyl-1,3,5-trimethylcyclotrisiloxane, 3-(3-acetoxypropyl)heptamethyltrisiloxane, 3-(m-pentadecylphenoxypropyl)heptamethyltrisiloxane, limonenyltrisiloxane, 3-dodecylheptamethyltrisiloxane, 3-octylheptamethyltrisiloxane, 1,3,5-triphenyltrimethylcyclotrisiloxane, 1,1,1,3,3,5,5-heptamethyltrisiloxane, 1,1,3,3,5,5-hexamethyltrisiloxane, 1,1,1,5,5,5-hexaethyl-3-methyltrisiloxane, 1,5-dichlorohexamethyltrisiloxane, 3-triacontylheptamethyltrisiloxane, 3-(3-hydroxypropyl)heptamethyltrisiloxane, hexamethylcyclomethylphosphonoxytrisiloxane, 3-octadecylheptamethyltrisiloxane, furfuryloxytrisiloxane, tetrakis(dimethylsiloxy)silane, 1,1,3,3,5,5,7,7-octamethyltetrasiloxane, 1,3-diphenyl-1,3-dimethyldisiloxane, octamethylcyclotetrasiloxane, 1,3-bis(trimethylsiloxy)-1,3-dimethyldisiloxane, bis(hydroxypropyl)tetramethyldisiloxane, tetra-n-propyltetramethylcyclotetrasiloxane, octaethylcyclotetrasiloxane, decamethyltetrasiloxane, dodecamethylcyclohexasiloxane, dodecamethylpentasiloxane, tetradecamethylhexasiloxane, hexaphenylcyclotrisiloxane, polyoctadecylmethylsiloxane, decamethylcyclopentasiloxane, poly(3,3,3-trifluoropropylmethylsiloxane), or 1,1,3,3,5,5,7,7,9,9-decamethylpentasiloxane.

3. The composition of claim 1, wherein the at least one additive comprises methanesulfonic acid, trifluoromethanesulfonic acid, methanesulfonic anhydride, trifluoromethanesulfonic anhydride, acetic anhydride, perchloric acid, nitric acid, sulfuric acid, toluenesulfonic acid, dodecylbenzenesulfonic acid, hydroiodic acid, hydrobromic acid, hydrochloric acid, chloric acid, trichloroacetic acid, trifluoroacetic acid, or fluorosulfuric acid.

4. The composition of claim 1, further comprising at least one organic solvent.

5. The composition of claim 4, wherein the at least one organic solvent is selected from the group consist of anhydrides, glycol ethers, glycol ether acetates, alkanes, aromatic hydrocarbons, sulfones, sulfoxides, ketones, aldehydes, esters, lactams, lactones, acetals, hemiacetals, alcohols, carboxylic acids, and ethers.

6. The composition of claim 4, wherein the at least one organic solvent comprises acetic anhydride, propylene glycol methyl ether acetate, a $C_6$-$C_{16}$ alkane, toluene, xylene, mesitylene, tetraethylene glycol dimethyl ether, propylene glycol dimethyl ether, ethylene glycol dimethyl ether, dipropylene glycol dimethyl ether, diethylene glycol dimethyl ether, dipropylene glycol dibutylether, n-dibutyl ether, dimethylsulfone, sulfolane, benzyl alcohol, t-butyl alcohol, t-amyl alcohol, methyl ethyl ketone, acetic acid, or isobutyl methyl ketone.

7. The composition of claim 4, wherein the at least one organic solvent is from about 3 wt % to about 95 wt % of the surface treatment composition.

8. The composition of claim 1, wherein the composition is substantially free of water.

9. The composition of claim 1, wherein the composition forms a surface treatment layer on a surface such that the surface treatment layer has a water contact angle of at least about 50 degrees.

10. A surface treatment composition, comprising:
- at least one siloxane compound in an amount of from about 0.1 wt % to about 99.9 wt % of the surface treatment composition, wherein the at least one siloxane compound comprises a disiloxane, an oligosiloxane, a cyclosilxoane, or a polysiloxane;
- at least one additive comprising a compound selected from the group consisting of sulfonic acids and sulfonic anhydrides and being in an amount of from about 0.1 wt % to about 10 wt % of the surface treatment composition; and
- at least one carboxylic acid or anhydride in an amount of from about 3 wt % to about 95 wt % of the surface treatment composition.

11. An article, comprising:
- a semiconductor substrate; and
- the surface treatment composition of claim 1 supported by the semiconductor substrate.

12. The article of claim 11, wherein the semiconductor substrate is a silicon wafer, a copper wafer, a silicon dioxide wafer, a silicon nitride wafer, a silicon oxynitride wafer, a carbon doped silicon oxide wafer, a SiGe wafer, or a GaAs wafer.

13. A kit, comprising:
- a first container comprising at least one siloxane compound, wherein the at least one siloxane compound comprises a disiloxane, an oligosiloxane, a cyclosilxoane, or a polysiloxane, provided that the at least one siloxane compound is not a polydimethylsiloxane; and
- a second container comprising at least one additive, the at least one additive comprising an acid having a pKa of at most 0 or an anhydride thereof.

14. The composition of claim 10, wherein the at least one siloxane compound comprises hexamethyldisiloxane, 1,3-diphenyl-1,3-dimethyldisiloxane, 1,1,3,3-tetramethyldisiloxane, 1,1,1-triethyl-3,3-dimethyldisiloxane, 1,1,3,3-tetra-n-octyldimethyldisiloxane, bis(nonafluorohexyl)tetramethyldisiloxane, 1,3-bis(trifluoropropyl) tetramethyldisiloxane, 1,3-di-n-butyltetramethyldisiloxane, 1,3-di-n-octyltetramethyldisiloxane, 1,3-diethyltetramethyldisiloxane, 1,3-diphenyltetramethyldisiloxane, hexa-n-butyldisiloxane, hexaethyldisiloxane, hexavinyldisiloxane, 1,1,1,3,3-pentamethyl-3-acetoxydisiloxane, 1-allyl-1,1,3,3-tetramethyldisiloxane, 1,3-bis(3-aminopropyl)tetramethyldisiloxane, 1,3-bis(heptadecafluoro-1,1,2,2-tetrahydrodecyl) tetramethyldisiloxane, 1,3-divinyltetraphenyldisiloxane, 1,3-divinyltetramethyldisiloxane, 1,3-diallyltetrakis(trimethylsiloxy)disiloxane, 1,3-diallyltetramethyldisiloxane, 1,3-diphenyltetrakis(dimethylsiloxy)disiloxane, (3-chloropropyl)pentamethyldisiloxane, 1,3-divinyltetrakis(trimethylsiloxy)disiloxane, 1,1,3,3-tetraisopropyldisiloxane, 1,1,3,3-tetravinyldimethyldisiloxane, 1,1,3,3-tetracyclopentyldichlorodisiloxane, vinylpentamethyldisiloxane, 1,3-bis(3-chloroisobutyl)tetramethyldisiloxane, hexaphenyldisiloxane, 1,3-bis[(bicyclo[2.2.1]hept-2-enyl)ethyl]tetramethyldisiloxane, 1,1,1-triethyl-3,3,3-trimethyldisiloxane, 1,3-bis(3-methacryloxypropyl)tetramethyldisiloxane, 1,3-bis(chloromethyl)tetramethyldisiloxane, 1,1,3,3-tetramethyl-1,3-diethoxydisiloxane, 1,1,3,3-tetraphenyldimethyldisiloxane, methacryloxypentamethyldisiloxane, pentamethyldisiloxane, 1,3-bis(3-chloropropyl)tetramethyldisiloxane, 1,3-bis(4-hydroxybutyl)tetramethyldisiloxane, 1,3-bis(triethoxysilylethyl)tetramethyldisiloxane, 3-aminopropylpentamethyldisiloxane, 1,3-bis(2-aminoethylaminomethyl)tetramethyldisiloxane, 1,3-bis(3-carboxypropyl)tetramethyldisiloxane, 1,3-dichloro-1,3-diphenyl-1,3-dimethyldisiloxane, 1,3-diethynyltetramethyldisiloxane, n-butyl-1,1,3,3-tetramethyldisiloxane, 1,3-dichlorotetraphenyldisiloxane, 1,3-dichlorotetramethyldisiloxane, 1,3-di-t-butyldisiloxane, 1,3-dimethyltetramethoxydisiloxane, 1,3-divinyltetraethoxydisiloxane, 1,1,3,3-tetraethoxy-1,3-dimethyldisiloxane, vinyl-1,1,3,3-tetramethyldisiloxane, platinum-[1,3-bis(cyclohexyl)imidazol-2-ylidene hexachlorodisiloxane, 1,1,3,3-tetraisopropyl-1-chlorodisiloxane, 1,1,1-trimethyl-3,3,3-triphenyldisiloxane, 1,3-bis(trimethylsiloxy)-1,3-dimethyldisiloxane, 3,3-diphenyltetramethyltrisiloxane, 3-phenylheptamethyltrisiloxane, hexamethylcyclotrisiloxane, n-propylheptamethyltrisiloxane, 1,5-diethoxyhexamethyltrisiloxane, 3-ethylheptamethyltrisiloxane, 3-(tetrahydrofurfuryloxypropyl)heptamethyltrisiloxane, 3-(3,3,3-trifluoropropyl)heptamethyltrisiloxane, 1,1,3,5,5-pentaphenyl-1,3,5-trimethyltrisiloxane, octamethyltrisiloxane, 1,1,5,5-tetraphenyl-1,3,3,5-tetramethyltrisiloxane, hexaphenylcyclotrisiloxane, 1,1,1,5,5,5-hexamethyltrisiloxane, octachlorotrisiloxane, 3-phenyl-1,1,3,5,5-pentamethyltrisiloxane, (3,3,3-trifluoropropyl) methylcyclotrisiloxane, 1,3,5-trivinyl-1,1,3,5,5-pentamethyltrisiloxane, 1,3,5-trivinyl-1,3,5-trimethylcyclotrisiloxane, 3-(3-acetoxypropyl) heptamethyltrisiloxane, 3-(m-pentadecylphenoxypropyl) heptamethyltrisiloxane, limonenyltrisiloxane, 3-dodecylheptamethyltrisiloxane, 3-octylheptamethyltrisiloxane, 1,3,5-triphenyltrimethylcyclotrisiloxane, 1,1,1,3,3,5,5-heptamethyltrisiloxane, 1,1,3,3,5,5-hexamethyltrisiloxane, 1,1,1,5,5,5-hexaethyl-3-methyltrisiloxane, 1,5-dichlorohexamethyltrisiloxane, 3-triacontylheptamethyltrisiloxane, 3-(3-hydroxypropyl) heptamethyltrisiloxane, hexamethylcyclomethylphosphonoxytrisiloxane, 3-octadecylheptamethyltrisiloxane, furfuryloxytrisiloxane, tetrakis(dimethylsiloxy)silane, 1,1,3,3,5,5,7,7-octamethyltetrasiloxane, 1,3-diphenyl-1,3,3-dimethyldisiloxane, octamethylcyclotetrasiloxane, 1,3-bis(trimethylsiloxy)-1,3-dimethyldisiloxane, a dimethylsiloxane-[65-70%(60% propylene oxide/40% ethylene oxide)] block copolymer, bis(hydroxypropyl)tetramethyldisiloxane, tetra-n-propyltetramethylcyclotetrasiloxane, octaethylcyclotetrasiloxane, decamethyltetrasiloxane, dodecamethylcyclohexasiloxane, dodecamethylpentasiloxane, tetradecamethylhexasiloxane, hexaphenylcyclotrisiloxane, polydimethylsiloxane, polyoctadecylmethylsiloxane, hexacosyl terminated polydimethylsiloxane, decamethylcyclopentasiloxane, poly(3,3,3-trifluoropropylmethylsiloxane), trimethylsiloxy terminated polydimethylsiloxane, or 1,1,3,3,5,5,7,7,9,9-decamethylpentasiloxane, or triethylsiloxy terminated polydiethylsiloxane.

15. The composition of claim 10, wherein the at least one siloxane compound is from about 0.1 wt % to about 55 wt % of the surface treatment composition.

16. The composition of claim 10, wherein the at least one additive comprises methanesulfonic acid, trifluoromethanesulfonic acid, methanesulfonic anhydride, trifluoromethanesulfonic anhydride, toluenesulfonic acid, or dodecylbenzenesulfonic acid.

17. The composition of claim 10, wherein the at least one additive is from about 0.1 wt % to about 5 wt % of the surface treatment composition.

18. The composition of claim 10, wherein the at least one carboxylic acid or anhydride comprises acetic acid or acetic anhydride.

19. The composition of claim 10, wherein the at least one carboxylic acid or anhydride is from about 50 wt % to about 95 wt % of the surface treatment composition.

20. The composition of claim 10, wherein the composition is substantially free of water.

21. The composition of claim 10, wherein the composition forms a surface treatment layer on a surface such that the surface treatment layer has a water contact angle of at least about 50 degrees.

22. An article, comprising:
a semiconductor substrate; and
the surface treatment composition of claim 10 supported by the semiconductor substrate.

23. The article of claim 22, wherein the semiconductor substrate is a silicon wafer, a copper wafer, a silicon dioxide wafer, a silicon nitride wafer, a silicon oxynitride wafer, a carbon doped silicon oxide wafer, a SiGe wafer, or a GaAs wafer.

* * * * *